US008659485B2

(12) United States Patent
Lan et al.

(10) Patent No.: US 8,659,485 B2
(45) Date of Patent: *Feb. 25, 2014

(54) ANTENNA DESIGNING METHOD AND DATA CARD SINGLE BOARD OF WIRELESS TERMINAL

(75) Inventors: Yao Lan, Shenzhen (CN); Shuhui Sun, Shenzhen (CN); Ping Lei, Shenzhen (CN); Yi Fan, Shenzhen (CN); Zhitai Zheng, Beijing (CN); Yanping Xie, Shenzhen (CN); Yongling Ban, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/590,807

(22) Filed: Aug. 21, 2012

(65) Prior Publication Data

US 2012/0314381 A1 Dec. 13, 2012

Related U.S. Application Data

(63) Continuation of application No. 13/290,695, filed on Nov. 7, 2011, which is a continuation of application No. PCT/CN2010/070407, filed on Jan. 29, 2010.

(30) Foreign Application Priority Data

May 8, 2009 (CN) .......................... 2009 1 0136609

(51) Int. Cl.
*H01Q 1/38* (2006.01)
*H01Q 19/00* (2006.01)
*H05K 1/11* (2006.01)

(52) U.S. Cl.
USPC ...... 343/700 MS; 361/748; 29/601; 343/833; 343/857

(58) Field of Classification Search
USPC .................................. 343/700 MS, 833, 857
See application file for complete search history.

(56) References Cited

U.S. PATENT DOCUMENTS 4,063,246 A 12/1977 Greiser
5,262,791 A 11/1993 Tsuda et al.

(Continued)

FOREIGN PATENT DOCUMENTS

CN 10886930 A 5/1994
CN 1299193 A 6/2001

(Continued)

OTHER PUBLICATIONS

Office Action issued in corresponding Chinese Patent Application No. 200910136609.0, mailed Apr. 12, 2011.

(Continued)

*Primary Examiner* — Jacob Y Choi
*Assistant Examiner* — Amal Patel
(74) *Attorney, Agent, or Firm* — Brinks Hofer Gilson & Lione

(57) ABSTRACT

An antenna designing method and a data card single board of a wireless terminal are provided. The antenna designing method provided by an embodiment of the present invention includes: dividing a semi-closed area without other metal wirings on a data card single board of the wireless terminal; and arranging an antenna wiring in the semi-closed area, where a gap exists between the antenna wiring and the data card single board, and the antenna wiring is coupled with the data card single board via the gap. The embodiments of the present invention also disclose a data card single board of the wireless terminal. According to the embodiments of the present invention, a Specific Absorption Rate (SAR) value of the antenna is reduced, and meanwhile, a working bandwidth of a broadband is realized.

8 Claims, 1 Drawing Sheet

(56) References Cited

U.S. PATENT DOCUMENTS

| | | | | |
|---|---|---|---|---|
| 5,657,028 | A | 8/1997 | Sanad | |
| 6,008,774 | A | 12/1999 | Wu | |
| 6,198,437 | B1 | 3/2001 | Watson et al. | |
| 6,388,625 | B1 | 5/2002 | Fukushima et al. | |
| 6,970,135 | B2 * | 11/2005 | Sato et al. | 343/702 |
| 7,265,724 | B1 * | 9/2007 | Tan et al. | 343/702 |
| 7,450,072 | B2 | 11/2008 | Kim et al. | |
| 7,466,997 | B2 | 12/2008 | Lin et al. | |
| 2001/0053672 | A1 | 12/2001 | Masaki | |
| 2002/0140610 | A1 | 10/2002 | Onaka et al. | |
| 2006/0017624 | A1 | 1/2006 | Nagano et al. | |
| 2006/0176219 | A1 | 8/2006 | Lu et al. | |
| 2006/0214850 | A1 | 9/2006 | O'Riordan et al. | |
| 2007/0273602 | A1 | 11/2007 | Zhu et al. | |

FOREIGN PATENT DOCUMENTS

| | | | |
|---|---|---|---|
| CN | 1423365 | A | 6/2003 |
| CN | 1633735 | A | 6/2005 |
| CN | 1767262 | A | 5/2006 |
| CN | 1841846 | A | 10/2006 |
| CN | 1949591 | A | 4/2007 |
| CN | 201114118 | Y | 9/2008 |
| CN | 101276960 | A | 10/2008 |
| CN | 101330165 | A | 12/2008 |
| CN | 101540432 | A | 9/2009 |
| EP | 0961344 | A1 | 12/1999 |
| EP | 1162688 | A1 | 12/2001 |
| JP | 06334421 | A | 12/1994 |
| JP | 2002299933 | A | 10/2002 |
| WO | WO 0124316 | A1 | 4/2001 |
| WO | WO 2005/062422 | A1 | 7/2005 |
| WO | WO 2006/137666 | A1 | 12/2006 |

OTHER PUBLICATIONS

English Abstract of CN1086930A.
English Abstract of CN1423365A.
English Abstract of CN1633735A.
English Abstract of CN101276960A.
English Abstract of CN101330165A.
English Abstract of CN101540432A.
English Abstract of CN201114118Y.
0911295PCT Publication and ISR for PCT WO2010/127566A1 for PCT/CN2010/070407, dated Nov. 11, 2010.
0911295US PCT Publication and ISR for PCT WO2010/127566A1 for PCT/CN2010/070407, dated Nov. 11, 2010.
0911295CN Office Action for Chinese Patent Application No. 200910136609.0, mailed Apr. 12, 2011.
Chinese Office Action Second for Patent Application No. 200910136609.0, dated Sep. 30, 2011.
Partial English Translation of Second Chinese Office Action No. 200910136609.0 mailed Sep. 30, 2011.
English Translation of Written Opinion of the International Searching Authority issued in corresponding PCT Patent Application No. PCT/CN2010/070407; mailed May 5, 2010.
Office Action issued in commonly U.S. Appl. No. 13/290,695, mailed Nov. 8, 2012.
Extended European Search Report issued in corresponding European Patent Application No. 10771969.2, mailed Jun. 5, 2013, 10 pages.
Office Action issued in corresponding Japanese Patent Application No. 2012-508886, mailed Feb. 19, 2013.
Office Action issued in commonly owned U.S. Appl. No. 13/290,695, mailed Mar. 7, 2013.
Office Action issued in commonly owned U.S. Appl. No. 13/290,695, mailed Jul. 5, 2013, 13 pages.

* cited by examiner

ANTENNA DESIGNING METHOD AND DATA CARD SINGLE BOARD OF WIRELESS TERMINAL

CROSS-REFERENCE TO RELATED APPLICATIONS

This application is a continuation of U.S. patent application Ser. No. 13/290,695, filed on Nov. 7, 2011, which is a continuation of International Application No. PCT/CN2010/070407, filed on Jan. 29, 2010. The International Application claims priority to Chinese Patent Application No. 200910136609.0, filed on May 8, 2009. The afore-mentioned patent applications are hereby incorporated by reference in their entireties.

FIELD OF THE DISCLOSURE

The present disclosure relates to the field of wireless communication technologies, and in particular, to an antenna designing method and a data card single board of a wireless terminal.

BACKGROUND

When an antenna is designed on a data card of a wireless terminal, the following technical problems exist, including the following. An available space of an antenna area is small; and requirements are strict for a short distance test of a Specific Absorption Rate (SAR) value.

The SAR represents an amount of radiation that is allowed to be absorbed by an organism (including a human body) per kilogram, and is a most direct test value denoting an impact of the radiation on the human body. The lower the SAR value is, the smaller the amount of the absorbed radiation is. In a current SAR test specification, when an SAR value is required to be tested, a distance from each face of the data card to a human body torso model for an SAR test should not be exceed 5 mm, and the SAR value should not exceed 1.2 mw/1 g. Therefore, it is a problem to be urgently solved to effectively reduce the SAR value without affecting other wireless performance indexes. Meanwhile, wireless communication has more and more requirements on a working bandwidth of the antenna, and it is hoped that an antenna may have multiple operational frequency bands on an ultra-wideband at the same time.

Currently, when the antenna is designed on the data card, built-in antennas in a form of monopole, Inverted-F Antenna (IFA), and Planar Inverted-F Antenna (PIFA) are widely used. The antennas of these forms are generally located at one end of the data card, and a data card single board acts as a "ground" of the antenna, which together constitute a radiator.

During the implementation of the present invention, the inventor finds that: in the antenna design in the prior art, in one aspect, the near-field energy of the antenna radiation is concentrated, causing that the SAR value is relatively large; and in another aspect, the antenna bandwidth is limited, which cannot satisfy a growing bandwidth requirement.

SUMMARY

An embodiment of the present invention provides an antenna designing method of a wireless terminal, including:

dividing a semi-closed area without other metal wirings on a data card single board of a wireless terminal; and arranging an antenna wiring in the semi-closed area, where a gap exists between the antenna wiring and the data card single board, and the antenna wiring is coupled with the data card single board via the gap.

An embodiment of the present invention provides a data card single board of a wireless terminal, including:

a semi-closed area, located on the data card single board of the wireless terminal, and having no other metal wirings in the semi-closed area; and an antenna wiring, arranged in the semi-closed area, where a gap exists between the antenna wiring and the data card single board, and the antenna wiring is coupled with the data card single board via the gap.

BRIEF DESCRIPTION OF THE DRAWINGS

To illustrate the technical solutions in the embodiments of the present invention more clearly, the accompanying drawings for describing the embodiments or the prior art are introduced briefly in the following. Apparently, the accompanying drawings in the following description are merely some embodiments of the present invention, and persons of ordinary skill in the art may obtain other drawings according to these accompanying drawings without creative efforts.

DETAILED DESCRIPTION OF THE EMBODIMENTS

It should be clear that, the embodiments to be described are merely a part rather than all of the embodiments of the present invention. All other embodiments obtained by persons of ordinary skill in the art based on the embodiments of the present invention without creative efforts shall fall within the protection scope of the present invention.

Embodiment 1

Figure 1:
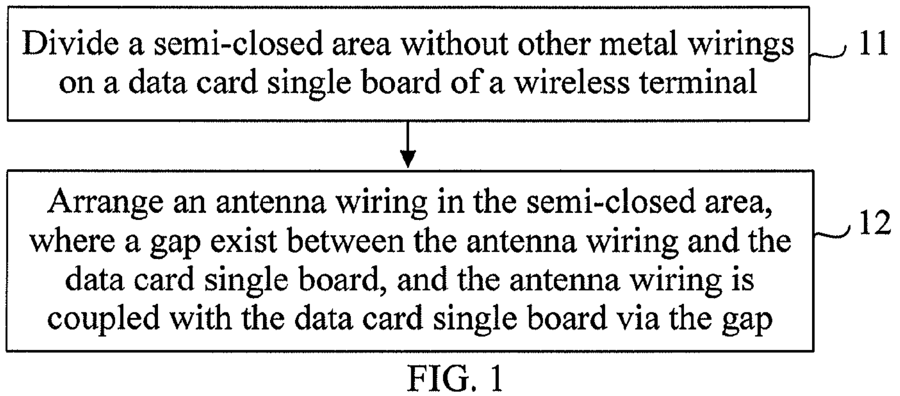
FIG. 1 is a schematic diagram of an antenna designing method of a wireless terminal according to an embodiment of the present invention.

Referring to FIG. 1, an embodiment of the present invention provides an antenna designing method of a wireless terminal, including the following.

Step S11, a semi-closed area without other metal wirings is divided on a data card single board of a wireless terminal.

In the specific implementation, it may be that the semi-closed area is divided on one side of the data card single board, and no other metal components are arranged on a printed broad in the semi-closed area; or, the printed board in the semi-closed area is cut off. The data card single board outside the semi-closed area is configured to arrange the other metal components.

Step S12, an antenna wiring is arranged in the semi-closed area, where a gap exists between the antenna wiring and the data card single board, and the antenna wiring is coupled with the data card single board via the gap.

The arranged antenna wiring is either printed on the printed board in the semi-closed area or soldered in the semi-closed area. In addition, the arranged antenna wiring is isolated from the data card single board by using a non-metal medium (for example, air), where the area distributed with no metal medium is the gap described in the present invention (similarly hereinafter).

In the antenna designing method of the wireless terminal provided by the embodiment of the present invention, the semi-closed area without other metal wirings is divided on the data card single board of the wireless terminal, and the antenna wiring is arranged in the semi-closed area. The data card single board is generally located in the center of the wireless terminal, and at this time, the distance from the antenna wiring to a cover of the wireless terminal is the longest, so that the antenna is kept away from a human body torso model for an SAR test to the utmost extent, thereby reducing the SAR value. It is designed that the antenna wiring is coupled with the data card single board via the gap, so that the electric field energy in the antenna wiring generates multiple resonance points with the data card single board in the gap, thereby realizing the working bandwidth of the broadband. In addition, the electric field energy may be dispersed in the relatively long gaps in the gap-coupling manner, which also helps to lower the centralized distribution of the energy and achieve the purpose of reducing the SAR value.

In an exemplary design scheme, the semi-closed area may be designed at one end of the data card single board close to a data communication interface of the wireless terminal, for example, at a position close to a Universal Serial Bus (USB) interface, a Personal Computer Memory Card International Association (PCMCIA) interface, an Express interface, or other interfaces, which facilitates the dispersion of the energy on the antenna to a portable device and reduce the SAR value.

The antenna wiring may be designed in an E-shaped or a comb-shaped horizontal distribution, so as to increase lengths of the gap via which the antenna wiring is coupled with the data card single board; therefore, the electric field energy in the antenna wiring may generate more resonance points with the data card single board via the gap, thereby realizing a required working bandwidth.

Optionally, one or more antenna matching points are disposed in the gap between the data card single board and the antenna wiring, where the antenna matching point may be one or a combination of devices such as a capacitor, an inductor, and a resistor. The antenna matching point is configured to adjust a coupling point position between the antenna wiring and the data card single board, so that the electric field energy in the antenna wiring generates multiple resonance points at appropriate positions in the gap.

A radio frequency signal is fed in the antenna through an antenna feeder and an antenna matching network. Resonance characteristics of the antenna may be adjusted by adjusting parameters of the antenna matching network, optimizing the shape of the antenna wiring, and optimizing the gap between the data card single board and the antenna wiring. In addition, the resonance characteristics of the antenna may be further adjusted by adjusting parameters of the antenna matching point and the position of the antenna matching point in the gap, and finally an antenna design with a UWB and a low SAR value working at 800 MHz to 2500 MHz is realized.

In an exemplary design scheme, a metal coupling piece is clad on the antenna wiring, and the metal coupling piece may be clad on upper and lower layers of the antenna wiring, or may be wholly or partially clad on only the upper layer or the lower layer of the antenna wiring. In the specific implementation, the metal coupling piece may be added to the upper layer, the lower layer, or the upper and lower layers of printed layers where the antenna wiring is located, and the metal coupling piece is coupled with the antenna wiring by using a non-metal medium or an air medium between the printed layers. The metal coupling piece is located in the semi-closed area, and the shape thereof is adjusted as required, which may be in any regular shape of rectangle, square, circle, rhombus, trapezoid, and triangle, or in an irregular shape. The metal coupling piece may be completely insulated from the antenna wiring, or may be conductively connected to the antenna wiring by adding one or more conductive connection points at appropriate positions.

A gap exists between the metal coupling piece and the data card single board. The metal coupling piece is coupled with the data card single board via the gap, so as to realize second coupling between the antenna wiring and the data card single board. In other words, an electric field in the antenna wiring is firstly coupled into the metal coupling piece, and then coupled into the data card single board by the metal coupling piece via the gap.

It can be understood that the one or more antenna matching points disposed in the gap between the data card single board and the antenna wiring are further configured to adjust the coupling point positions between the metal coupling piece and the data card single board.

A radio frequency signal is fed in the antenna through an antenna feeder and an antenna matching network. Resonance characteristics of the antenna may be adjusted by adjusting parameters of the antenna matching network, optimizing the shape of the antenna wiring, optimizing the shape of the metal coupling piece, and optimizing the gap between the data card single board and the antenna wiring as well as the metal coupling piece. In addition, the resonance characteristics of the antenna may be further adjusted by adjusting parameters of the antenna matching point and the position of the antenna matching point in the gap, and finally an antenna design with a UWB and a low SAR value working at 800 MHz to 2500 MHz is realized.

Embodiment 2

Figure 2:
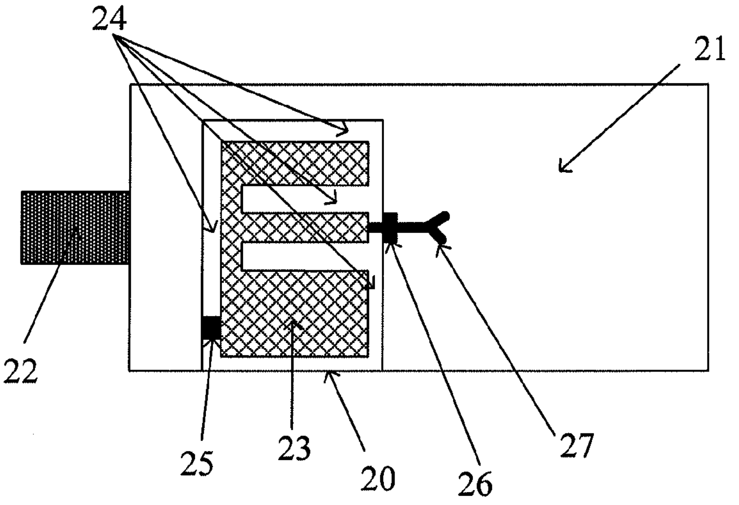
FIG. 2 is a schematic structural diagram of a data card single board of a wireless terminal according to an embodiment of the present invention.

Referring to FIG. 2, a semi-closed area 20 without other metal wirings is divided on a part of a data card single board 21 close to a USB interface 22, where the semi-closed area 20 is not limited to a rectangular shape as shown in FIG. 2, and may be in any regular shape of square, circle, rhombus, trapezoid, and triangle, or in an irregular shape. The semi-closed area 20 includes: an antenna wiring 23, gaps 24 between the antenna wiring 23 and the data card single board 21, and an antenna matching point 25. An antenna matching network 26 and an antenna feeder 27 are printed on the data card single board 21 outside the semi-closed area 20. In addition, the antenna matching network 26 is located at an edge position of the semi-closed area 20, and the antenna feeder 27 is connected to the antenna wiring 23 through the antenna matching network 26.

The antenna wiring 23 may be, but not limited to, E-shaped as shown in FIG. 2, and may also be in a comb-shaped horizontal distribution. The antenna wiring 23 is disposed in the semi-closed area 20 in a printing or soldering manner. With the E-shaped or comb-shaped antenna wiring 23, lengths of the gap via which the antenna wiring 23 is coupled with the data card single board 21 are increased, so that the electric field energy in the antenna wiring 23 generates more resonance points with the data card single board 21 via the gap 24, thereby realizing a required working bandwidth.

The antenna designing area 20 is located at a portion close to the USB interface 22, which facilitates the dispersion of the energy on the antenna to a portable device. The antenna wiring 23 is printed or soldered in the antenna designing area 20. The data card single board 21 is generally located in the center of the wireless terminal, and at this time, the distance from the antenna wiring 23 to a cover of the wireless terminal is the longest, so that the antenna is kept away from a human body torso model for an SAR test to the utmost extent, thereby reducing the SAR value. Meanwhile, since the antenna wiring 23 may be coupled with the data card single board 21 in the relatively long gaps 24, so that the electric field energy in the antenna wiring 23 generates multiple resonance points with the data card single board 21 in the gap 24 , thereby realizing the working bandwidth of the broadband. In addition, the electric field energy coupled via the gap may be dispersed in the relatively long gaps, which also helps to lower the centralized distribution of the energy and achieve the purpose of reducing the SAR value.

The antenna matching point 25 is located in the gap 24 between the antenna wiring 23 and the data card single board 21. One or more antenna matching points 25 may be disposed, and the position in the gap 24 may be adjusted. The antenna matching point 25 is configured to adjust a coupling point position between the antenna wiring 23 and the data card single board 21, so that the electric field energy in the antenna wiring 23 generates multiple resonance points at appropriate positions in the gap.

A radio frequency signal is fed in the antenna wiring 23 by the antenna feeder 27 through the antenna matching network 26. Resonance characteristics of the antenna may be adjusted by optimizing the shape of the antenna wiring 23, and optimizing the gap 24 between the data card single board 21 and the antenna wiring 23. In addition, the resonance characteristics of the antenna may be further adjusted by adjusting parameters of the antenna matching network 26, parameters of the antenna matching point 25, and the position of the antenna matching point 25 in the gap 24, and finally an antenna design with a UWB and a low SAR value working at 800 MHz to 2500 MHz is realized.

Embodiment 3

Figure 3:
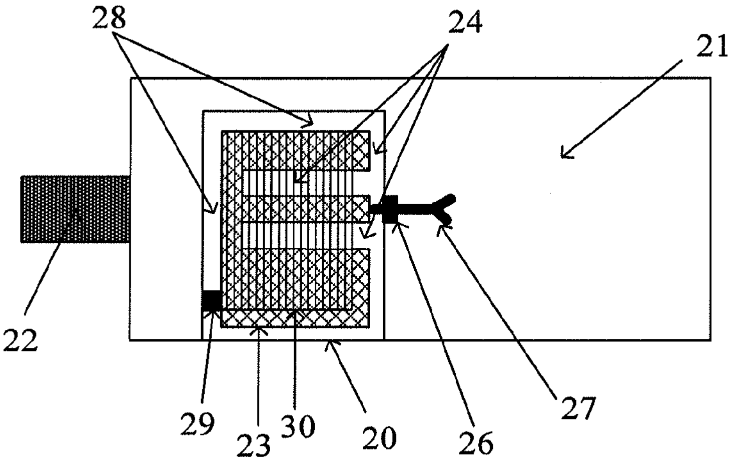
FIG. 3 is a schematic structural diagram of another data card single board of a wireless terminal according to an embodiment of the present invention.

As shown in FIG. 3, this embodiment differs from Embodiment 2 in that: a metal coupling piece 30 is clad on the antenna wiring 23, and the metal coupling piece 30 is coupled with the antenna wiring 23 by using a non-metal medium or an air medium between printed layers. Gaps 28 exist between the metal coupling piece 30 and the data card single board 21, and the metal coupling piece 30 is coupled with the data card single board 21 via the gap 28, so as to realize second coupling between the antenna wiring 23 and the data card single board 21.

Referring to FIG. 3, a semi-closed area 20 without other metal wirings is divided on a part of a data card single board 21 close to a USB interface 22, where the semi-closed area 20 may be in any regular shape of rectangle, square, circle, rhombus, trapezoid, and triangle, or in an irregular shape. The semi-closed area 20 includes: an antenna wiring 23, a metal coupling piece 30, gaps 24 between the antenna wiring and the data card single board, gaps 28 between the metal coupling piece and the data card single board, and an antenna matching point 29. An antenna matching network 26 and an antenna feeder 27 are printed on the data card single board outside the semi-closed area 20. In addition, the antenna matching network 26 is located at an edge position of the semi-closed area 20, and the antenna feeder 27 is connected to the antenna wiring 23 through the antenna matching network 26.

In order to increase lengths of the gap 24 via which the antenna wiring is coupled with the data card single board, the antenna wiring 23 may be in an E-shaped or a comb-shaped horizontal distribution, and is disposed in the semi-closed area 20 in a printing or soldering manner. The metal coupling piece 30 is clad on the antenna wiring 23, and is located in the semi-closed area 20. Gaps 28 exist between the metal coupling piece 30 and the data card single board 21, and the metal coupling piece 30 is coupled with the data card single board 21 via the gap 28. Therefore, in one aspect, the antenna wiring 23 may be directly coupled with the data card single board 21 via the gap 24; in another aspect, the antenna wiring 23 may also firstly couple a part of energy into the metal coupling piece 30, and then the metal coupling piece 30 couples the energy into the data card single board 21 via the gap 28.

The metal coupling piece 30 is not limited to a rectangular shape as shown in FIG. 3, and may also be in any regular shape of square, circle, rhombus, trapezoid, and triangle, or in an irregular shape. The metal coupling piece 30 may be completely insulated from the antenna wiring 23, or may be conductively connected to the antenna wiring 23 by adding one or more conductive connection points (not shown in FIG. 3) at appropriate positions.

The antenna designing area 20 is located at a position close to the USB interface 22, which facilitates the dispersion of the energy on the antenna to a portable device. The antenna wiring 23 is printed or soldered in the antenna designing area 20, so that the distance from the antenna wiring 23 to a cover of the wireless terminal is the longest, and the antenna is kept away from a human body torso model for an SAR test to the utmost extent, thereby reducing the SAR value. Meanwhile, since the antenna wiring 23 is coupled with the metal coupling piece 30 and the data card single board 21 for several times via the gap, multiple resonance points are generated, to realize the working bandwidth of the broadband. In addition, the electric field energy in the antenna wiring 23 and the metal coupling piece 30 may be dispersed in the relatively long gaps in the gap-coupling manner, which also helps to lower the centralized distribution of the energy and achieve the purpose of reducing the SAR value.

The antenna matching point 29 is located in the gap between the antenna wiring 23 and/or the metal coupling piece 30 and the data card single board 21. One or more antenna matching points 29 may be disposed, and the position thereof in the gap may be adjusted. The antenna matching point 29 is configured to adjust a coupling point position between the antenna wiring 23 and/or the metal coupling piece 30 and the data card single board 21, so that the electric field energy in the antenna wiring 23 generates multiple resonance points at appropriate positions in the gap.

A radio frequency signal is fed in the antenna wiring 23 by the antenna feeder 27 through the antenna matching network 26. Resonance characteristics of the antenna may be adjusted by adjusting parameters of the antenna matching network 26, optimizing the shape of the antenna wiring 23, optimizing the shape of the metal coupling piece 30, optimizing the gap 28 between the data card single board 21 and the metal coupling piece 30, and optimizing the gap 24 between the data card single board 21 and the antenna wiring 23. In addition, the resonance characteristics of the antenna may be further adjusted by adjusting parameters of the antenna matching point 29 and the position of the antenna matching point 29 in the gap 28 and/or 24, and finally an antenna design with a UWB and a low SAR value working at 800 MHz to 2500 MHz is realized.

Embodiment 4

Referring to FIG. 2 and FIG. 3, an embodiment of the present invention provides a data card single board of a wireless terminal, including:

a semi-closed area 20, located on the data card single board of the wireless terminal, and having no other metal wirings in the semi-closed area;

a semi-closed area 20, which may be in any regular shape of rectangle, square, circle, rhombus, trapezoid, and triangle, or in an irregular shape; and an antenna wiring 23, arranged in the semi-closed area 20, where a gap exists between the antenna wiring 23 and the data card single board, and the antenna wiring 23 is coupled with the data card single board via the gap.

Preferably, the semi-closed area 20 is located at one end of the data card single board close to a data communication interface 22 of the wireless terminal, which facilitates the dispersion of the energy on the antenna to a portable device.

Preferably, the antenna wiring 23 is in a horizontal distribution. The horizontal distribution may be, but not limited to, an E-shape as shown in FIG. 2 and FIG. 3, and may also be a comb-shaped horizontal distribution. The antenna wiring 23 is disposed in the semi-closed area 20 in a printing or soldering manner. With the E-shaped or comb-shaped antenna wiring, lengths of the gap via which the antenna wiring is coupled with the data card single board are increased, so that the electric field energy in the antenna wiring 23 generates more resonance points with the data card single board 21 via the gap 24, thereby realizing a required working bandwidth.

Optionally, the data card single board of the wireless terminal further includes: at least one antenna matching point 25, disposed in the gap between the antenna wiring 23 and the data card single board, and configured to adjust a coupling point position between the antenna wiring and the data card single board.

Preferably, the data card single board of the wireless terminal further includes: a metal coupling piece 30, clad on the antenna wiring 23, where a gap exists between the metal coupling piece 30 and the data card single board, and the metal coupling piece 30 is coupled with the data card single board via the gap, so as to realize second coupling between the antenna wiring and the data card single board. Therefore, in one aspect, the antenna wiring 23 may be directly coupled with the data card single board 21 via the gap 24; in another aspect, the antenna wiring 23 may also firstly couple a part of energy into the metal coupling piece 30, and then the metal coupling piece 30 couples the energy into the data card single board 21 via the gap 28. At this time, an antenna matching point 29 is further configured to adjust a coupling point position between the metal coupling piece 30 and the data card single board, so that the electric field energy in the antenna wiring generates multiple resonance points at appropriate positions in the gap.

The antenna wiring 23 is disposed in the semi-closed area 20. The data card single board is generally located in the center of the wireless terminal, and at this time, the distance from the antenna wiring to a cover of the wireless terminal is the longest, and the antenna is kept away from a human body torso model for an SAR test to the utmost extent, thereby reducing the SAR value. Meanwhile, since the antenna wiring 23 may be coupled with the data card single board in the relatively long gaps 24, the electric field energy in the antenna wiring 23 generates multiple resonance points with the data card single board in the gap 24, and the metal coupling piece 30 is coupled with the data card single board 21 for several times via the gap 28, so as to realize the working bandwidth of the broadband. In addition, the electric field energy in the antenna wiring may be dispersed in the relatively long gaps, the metal coupling piece and the antenna radiator itself in the gap-coupling manner, which also helps to lower the centralized distribution of the energy and achieve the purpose of reducing the SAR value.

In conclusion, in the embodiments of the present invention, the semi-closed area without other metal wirings is divided on the data card single board, and the semi-closed area merely includes design elements such as the antenna wiring and the gap. The antenna design with a UWB and a low SAR value is finally realized by optimizing the shape of the semi-closed area and the design elements in the semi-closed area.

The above specific embodiments are not intended to limit the present invention. For persons of ordinary skills in the art, any modification, equivalent replacement, or improvement made without departing from the principle of the present invention should fall within the protection scope of the present invention.

What is claimed is:

1. An antenna designing method of a wireless terminal, comprising:

on a planar surface of a data card single board of the wireless terminal, dividing a semi-closed area without other metal wirings belonging to a remaining area of the data card single board, wherein the semi-closed area and the remaining area of the data card single board are co-planar to each other on the same planar surface;

arranging an entire antenna wiring within the semi-closed area, wherein the entire antenna wiring is co-planar to the same planar surface, wherein:

at least one gap exists on the same planar surface between the entire antenna wiring and the remaining area of the data card single board, and at least a portion of the entire antenna wiring is coupled to at least a portion of the remaining area of the data card single board via the at least one gap, and the entire antenna wiring comprises a plurality of co-planar metal traces, wherein each of the plurality of co-planar metal traces orthogonally protrudes out from a co-planar main metal trace to an open end, such that the plurality of orthogonally protruded co-planar metal traces and the co-planar main metal trace form a comb-shape co-planar structure; and cladding a planar metal coupling piece over more than half portion of the entire antenna wiring, wherein:

at least another gap exists to space the planar metal coupling piece from the remaining area of the data card single board, and the planar metal coupling piece does not overlap any portion of the remaining area of the data card single board, and the planar metal coupling piece is coupled to a selected portion of the remaining area of the data card single board via the at least another gap in order to realize a second coupling between the entire antenna wiring and the remaining area of the data card single board.

2. The antenna designing method according to claim 1, wherein the semi-closed area is located at one end of the remaining area of the data card single board in proximity to a data communication interface of the wireless terminal.

3. The antenna designing method according to claim 1, wherein at least one antenna matching point is disposed in the at least one gap between the entire antenna wiring and the remaining area of the data card single board, in order to adjust a coupling point position between the entire antenna wiring and the remaining area of the data card single board.

4. The antenna designing method according to claim 3, wherein at least one antenna matching point is disposed in the at least one gap between the entire antenna wiring and the remaining area of the data card single board, in order to adjust the coupling point position between the metal coupling piece and the remaining area of the data card single board.

5. A data card single board of a wireless terminal, comprising:

on a planar surface of the data card single board of the wireless terminal, comprises a semi-closed area without other metal wirings belonging to a remaining area of the data card single board, wherein the semi-closed area and the remaining area of the data card single board are co-planar to each other on the same planar surface; and an entire antenna wiring, arranged within the semi-closed area, wherein the entire antenna wiring is co-planar to the same planar surface, wherein:

at least one gap exists on the same planar surface between the entire antenna wiring and the remaining area of the data card single board, and at least a portion of the entire antenna wiring is coupled to at least a portion of the remaining area of the data card single board via the at least one gap, and the entire antenna wiring comprises a plurality of co-planar metal traces, wherein each of the plurality of co-planar metal traces orthogonally protrudes out from a co-planar main metal trace to an open end, such that the plurality of orthogonally protruded co-planar metal traces and the co-planar main metal trace form a comb-shape co-planar structure; and a planar metal coupling piece cladding over more than half portion of the entire antenna wiring, wherein:

at least another gap exists to space the planar metal coupling piece from the remaining area of the data card single board, and the planar metal coupling piece does not overlap any portion of the remaining area of the data card single board, and the planar metal coupling piece is coupled to a selected portion of the remaining area of the data card single board via the at least another gap in order to realize a second coupling between the entire antenna wiring and the remaining area of the data card single board.

6. The data card single board according to claim 5, wherein the semi-closed area is located at one end of the remaining area of the data card single board in proximity to a data communication interface of the wireless terminal.

7. The data card single board according to claim 5, further comprising:

at least one antenna matching point, disposed in the at least one gap between the entire antenna wiring and the remaining area of the data card single board, and the at least one antenna matching point is configured to adjust a coupling point position between the entire antenna wiring and the remaining area of the data card single board.

8. The data card single board according to claim 7, wherein the at least one antenna matching point is further configured to adjust the coupling point position between the planar metal coupling piece and the remaining area of the data card single board.

* * * * *